(12) United States Patent
Pan

(10) Patent No.: US 12,738,450 B2
(45) Date of Patent: Sep. 15, 2026

(54) CONTROL SYSTEM AND METHOD FOR ION ENERGY DISTRIBUTION IN PLASMA PROCESS CHAMBERS USING TAILORED WAVEFORM GENERATORS

(71) Applicant: Yang Pan, Singapore (SG)

(72) Inventor: Yang Pan, Singapore (SG)

(73) Assignee: Inspiring Atoms Pte Ltd, Singapore (SG)

( * ) Notice: Subject to any disclaimer, the term of this patent is extended or adjusted under 35 U.S.C. 154(b) by 132 days.

(21) Appl. No.: 18/807,972

(22) Filed: Aug. 17, 2024

(65) Prior Publication Data

US 2026/0051454 A1 Feb. 19, 2026

(51) Int. Cl.
*H01J 37/24* (2006.01)
*H01J 37/32* (2006.01)

(52) U.S. Cl.
CPC ........ *H01J 37/243* (2013.01); *H01J 37/3299* (2013.01); *H01J 2237/2007* (2013.01)

(58) Field of Classification Search
None
See application file for complete search history.

(56) References Cited

U.S. PATENT DOCUMENTS 6,509,542 B1 1/2003 Benjamin et al.
6,920,312 B1 7/2005 Benjamin
8,692,467 B2 4/2014 Benjamin et al.
8,736,175 B2 5/2014 Long et al.
8,736,377 B2 5/2014 Rughoonundon et al.
8,741,095 B2 6/2014 Koshimizu
8,962,488 B2 2/2015 Liao et al.
9,059,678 B2 6/2015 Long et al.
9,171,700 B2 10/2015 Gilmore
9,210,790 B2 12/2015 Hoffman et al.
9,305,750 B2 4/2016 Long et al.
9,309,594 B2 4/2016 Hoffman et al.
9,336,996 B2 5/2016 Long et al.
9,362,089 B2 6/2016 Brouk et al.
9,390,893 B2 7/2016 Valcore, Jr. et al.
9,401,264 B2 7/2016 Marakhtanov et al.
9,515,633 B1 12/2016 Long et al.
9,536,749 B2 1/2017 Marakhtanov et al.
9,595,423 B2 3/2017 Leray et al.
9,627,186 B2 4/2017 Valcore, Jr. et al.
9,652,567 B2 5/2017 Valcore, Jr. et al.
9,659,757 B2 5/2017 Kuthi et al.
9,721,758 B2 8/2017 Coumon et al.
9,872,373 B1 1/2018 Shimizu et al.
9,984,859 B2 5/2018 Marakhtanov et al.
10,032,605 B2 7/2018 Valcore, Jr. et al.
10,056,231 B2 8/2018 Long et al.
10,102,321 B2 10/2018 Povolny et al.
10,141,163 B2 11/2018 Lill et al.
(Continued)

*Primary Examiner* — Kenneth B Wells

(57) ABSTRACT

Disclosed herein is a real-time control and optimization system for a plasma process system, specifically focusing on a tailored waveform generator coupled to a chuck. The system employs a system controller that divides the process recipe into a setting phase and a processing phase. The setting phase is used to determine optimized slopes for voltage waveforms during plasma processing. This innovation enhances the precision and consistency of ion energy and current during plasma etching and related processes.

15 Claims, 8 Drawing Sheets

(56) References Cited

Figure 1A:
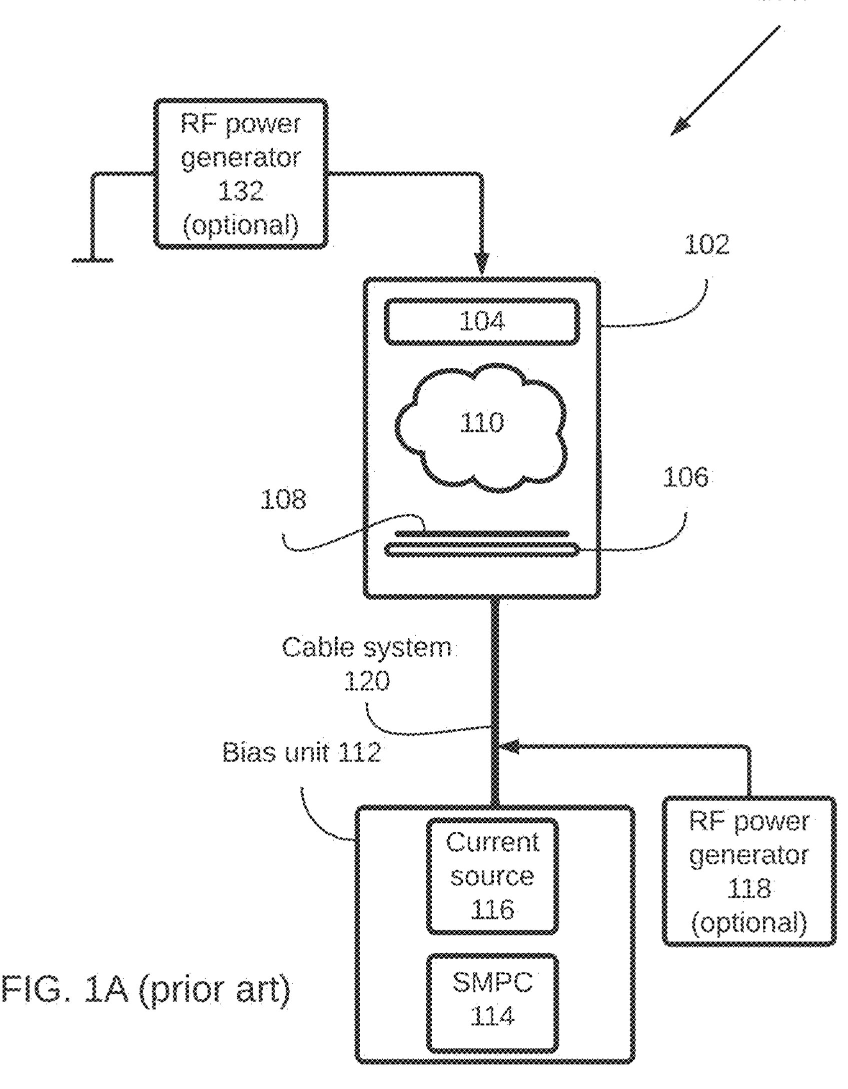

U.S. PATENT DOCUMENTS 10,157,729 B2 12/2018 Valcore, Jr.
10,256,077 B2 4/2019 Valcore, Jr. et al.
10,276,348 B2 4/2019 Marakhtanov et al.
10,325,759 B2 6/2019 Valcore, Jr. et al.
10,325,760 B2 6/2019 Valcore, Jr. et al.
10,373,804 B2 8/2019 Koh et al.
10,381,201 B2 8/2019 Lyndaker et al.
10,403,482 B2 9/2019 Howald et al.
10,431,434 B2 10/2019 Long et al.
10,573,494 B2 2/2020 Shoeb et al.
10,580,618 B2 3/2020 Shoeb et al.
10,679,825 B2 6/2020 Wu et al.
10,734,195 B2 8/2020 Long et al.
10,755,895 B2 8/2020 Marakhtanov et al.
10,847,345 B2 11/2020 Long et al.
10,984,985 B2 4/2021 Mavretic
11,114,280 B2 9/2021 Bhutta et al.
11,158,488 B2 10/2021 Radomski et al.
11,224,116 B2 1/2022 Long et al.
11,437,219 B2 9/2022 Long et al.
11,716,059 B2 8/2023 Raymond et al.
11,915,912 B2 2/2024 Shoeb et al.
2015/0235808 A1 8/2015 Kamp et al.
2016/0268100 A1 9/2016 Valcore, Jr. et al.
2017/0084429 A1 3/2017 Marakhtanov et al.
2017/0372912 A1 12/2017 Long et al.
2018/0358205 A1 12/2018 Long et al.
2019/0109576 A1 4/2019 Long et al.
2020/0168438 A1 5/2020 Shoeb et al.
2020/0227289 A1* 7/2020 Song ................ H01L 21/67069
2020/0243304 A1 7/2020 Valcore, Jr. et al.
2021/0183619 A1 6/2021 Patrick et al.
2021/0210314 A1 7/2021 Wang et al.
2022/0199365 A1 6/2022 Long et al.
2022/0216038 A1 7/2022 Wu et al.
2022/0262599 A1* 8/2022 Kim ................. H01J 37/32146
2023/0113683 A1 4/2023 Long
2023/0126058 A1 4/2023 Long et al.
2023/0245873 A1 8/2023 Long et al.
2023/0290611 A1 9/2023 Benjamin et al.
2023/0360883 A1 11/2023 Long et al.
2024/0071721 A1 2/2024 Brouk et al.
2024/0079210 A1* 3/2024 Nguyen ........... H01J 37/32146
2024/0105430 A1* 3/2024 Yu .......................... C23C 16/50
2024/0170255 A1* 5/2024 Yoon ................ H01J 37/32146

* cited by examiner

| Step | Pulse | Slope |
|---|---|---|
| T1 | P1 | S1 |
| T2 | P2 | S2 |
| T3 | P3 | S3 |
| ... | ... | ... |
| Tn | Pn | Sn |

| Step | Pulse | Slope |
|---|---|---|
| Tn+1 | Pn+1 | So |
| Tn+2 | Pn+2 | So |
| Tn+3 | Pn+3 | So |
| ... | ... | ... |
| Tn+m | Pn+m | So |

CONTROL SYSTEM AND METHOD FOR ION ENERGY DISTRIBUTION IN PLASMA PROCESS CHAMBERS USING TAILORED WAVEFORM GENERATORS

FIELD OF INVENTION

This invention generally pertains to plasma process systems utilized in semiconductor manufacturing and related fields. More specifically, it relates to the real-time control and optimization of a tailored waveform bias, enabling precise control over ion energy and current during plasma-enhanced processes, such as etching, within a plasma process chamber.

BACKGROUND

Plasma process systems are fundamental tools in the semiconductor manufacturing industry, playing a crucial role in various applications, such as etching, deposition, and cleaning processes, among others. Critical to the efficacy of these processes is the meticulous control of plasma properties, including ion energies and ion current densities, which directly impact the uniformity and precision of the results achieved on the substrate, often a semiconductor wafer.

Plasma process chambers utilize radio frequency (RF) power to ignite and sustain plasma, and a bias, in the form of a tailored waveform, to precisely control ion energies and their distribution at the wafer surface. This waveform bias is pivotal in achieving the desired etching profiles, particularly for etching of a dielectric film. A typical challenge lies in optimizing the waveform bias, especially the slope in a linear ramp step, to uphold a consistent wafer surface potential and consequently, stable ion energy and current at the wafer surface.

Conventional methodologies might rely on predefined bias profiles, based on models or historical data, which may lack adaptability to account for variations in real-world processing conditions, substrate properties, or chamber states. Moreover, the conventional methods might not effectively respond to the dynamic changes in process requirements or variations in plasma properties over time, potentially compromising process outcomes.

Adjusting and tuning the waveform bias, particularly the slope, which affects the wafer surface potential and thus the ion energies and current, in real-time, to achieve optimal and consistent processing results, has been a complex and elusive pursuit. Striking a balance between maintaining the desired processing conditions and adapting to dynamic internal and external factors, without causing disruptions or deviations in established process recipes, requires a system that can intelligently and autonomously evaluate, determine, and apply optimal waveform bias parameters during operation.

Therefore, there exists a need for a system and method that offers real-time, dynamic optimization and control over the waveform bias, ensuring consistent, precise, and high-quality outcomes in plasma processes, while maintaining the flexibility and adaptability to accommodate varied processing conditions, substrate properties, and chamber states, enhancing overall reliability and performance in plasma processing applications.

SUMMARY

The presented invention encompasses a system and methodology designed to optimize and control waveform bias in a plasma process chamber, crucial for achieving enhanced control and consistency in ion energy and current during plasma-assisted processes, including etching. This is particularly important where wafer surface potential and ion energy distribution need to be meticulously managed to meet precise process requirements.

In the context of the plasma process chamber, the ion energy and current, especially during etching processes, are governed by a tailored waveform bias, which is characteristically defined by its slope, S for a ramp step. This slope influences the wafer surface potential, $u_{sh}$, and thus, directly impacts the ion energy and current within the plasma. Precise control over these variables is critical in ensuring uniform and consistent results during processing.

In some embodiments, a system controller reconstructs a conventional process recipe into a bifurcated approach, comprising a setting phase and a processing phase, each contributing to optimizing and applying the waveform bias, respectively. During the setting phase, the controller generates a pulse train comprising multiple pulses, each pulse characterized by a distinct slope. A current sensor and the controller work in tandem to measure and analyze the output current of a bias unit resulting from each pulse in real-time. The controller identifies an optimized slope corresponding to a minimal change of the current as a function of the varied slope.

Once identified, the optimized slope S is then utilized during the subsequent processing phase to ensure the waveform bias is as efficacious as possible, thereby maintaining a consistent wafer surface potential and ion energy throughout the process. This methodology allows for dynamic adjustment and optimization of the waveform bias, adapting to the specific needs of different processes and conditions without the need to manually alter process recipes.

In some other embodiments, the system has the capability to store and apply the optimized slope S for future processes, ensuring replicable results and reduced need for continual optimization during repetitive processes. Moreover, it provides a framework where the setting phase can be seamlessly integrated at various points during the processing phase or even applied selectively for certain wafers, thereby offering both flexibility and precision in controlling the plasma processes.

In essence, the invention bridges real-time control, dynamic adaptability, and practical utility, establishing a robust system capable of maintaining optimal ion energy and current during plasma processes by intelligently and autonomously adjusting the waveform bias via a methodologically sound, two-phased approach. This strategy ensures the practicality, reliability, and repeatability of plasma processes, which is foundational for ensuring high-quality outcomes in applications where plasma processing plays a pivotal role.

BRIEF DESCRIPTIONS OF THE DRAWINGS

For enhanced clarity, the following description refers to accompanying drawings:

FIG. 1A: Illustrates a conventional process system, outfitted with a tailored waveform generator as a bias unit for a chuck.

Figure 1B:
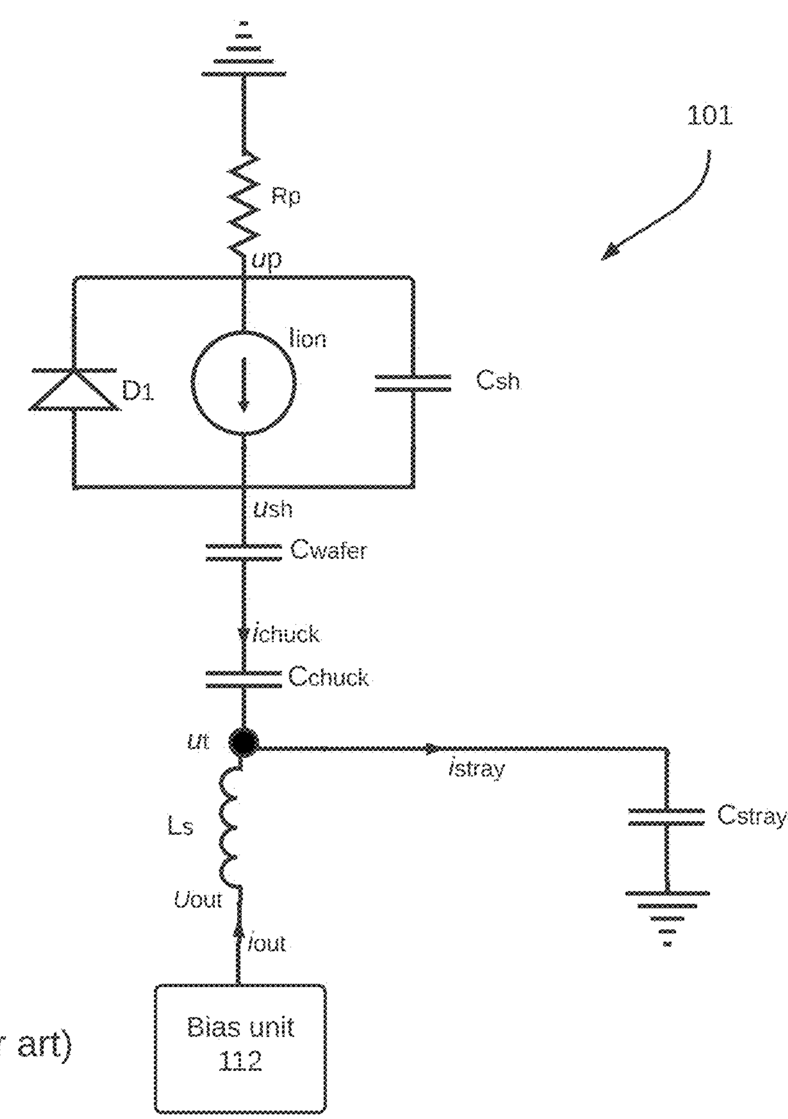

FIG. 1B: Presents an equivalent electrical circuit of a plasma process chamber, incorporating the tailored waveform bias.

Figure 1C:
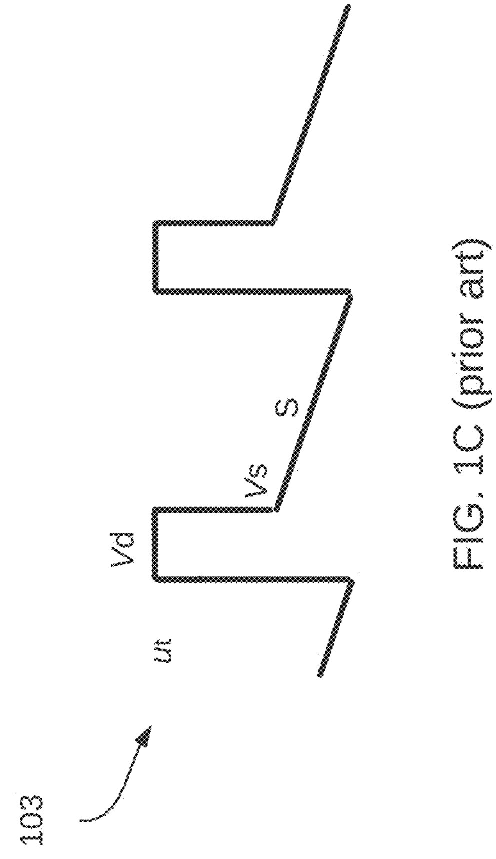

FIG. 1C: Depicts an example of a tailored waveform.

Figure 2A:
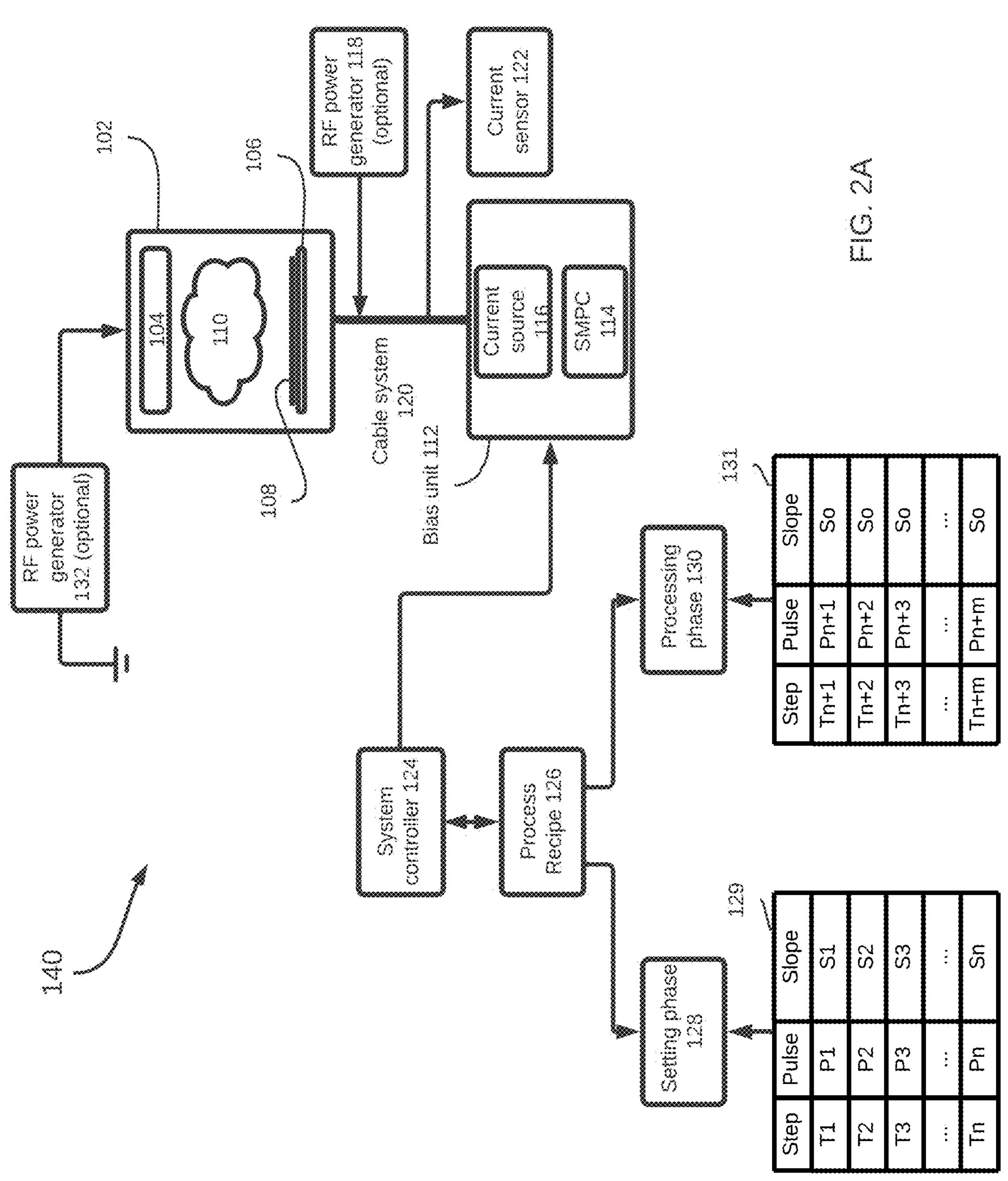

FIG. 2A: Represents an embodiment of a tailored waveform bias endowed with real-time control capabilities.

Figure 2B:
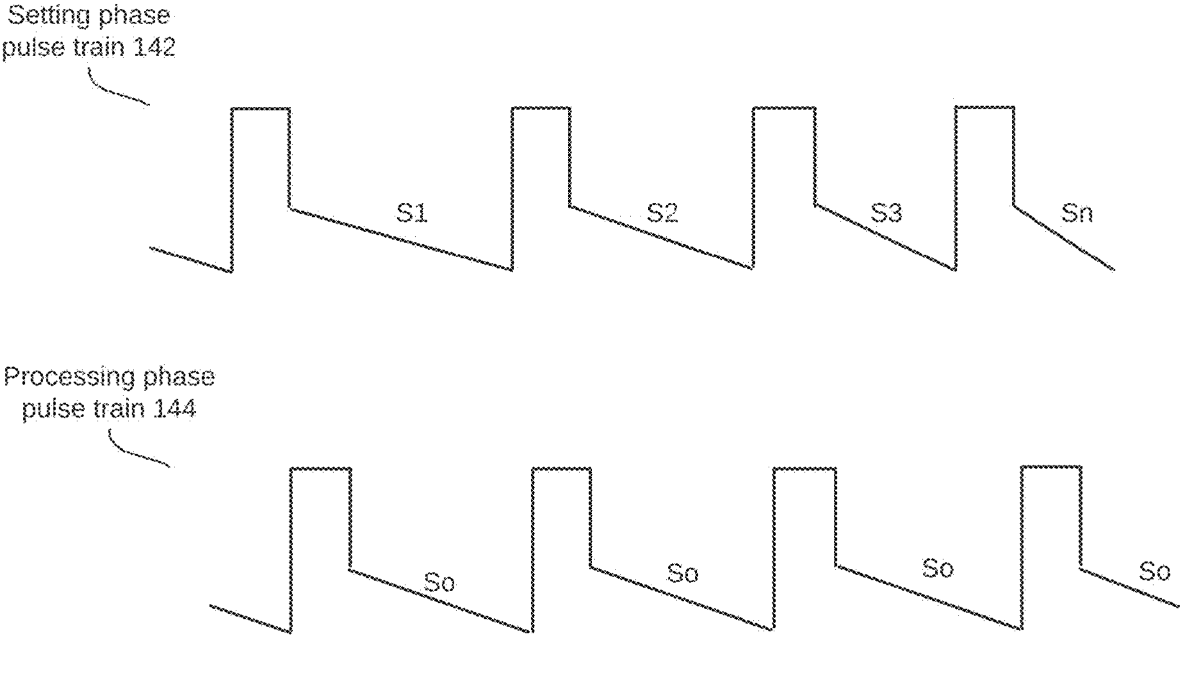

FIG. 2B: Exhibits exemplary pulse trains designated for a setting phase, as well as a processing phase.

Figure 3:
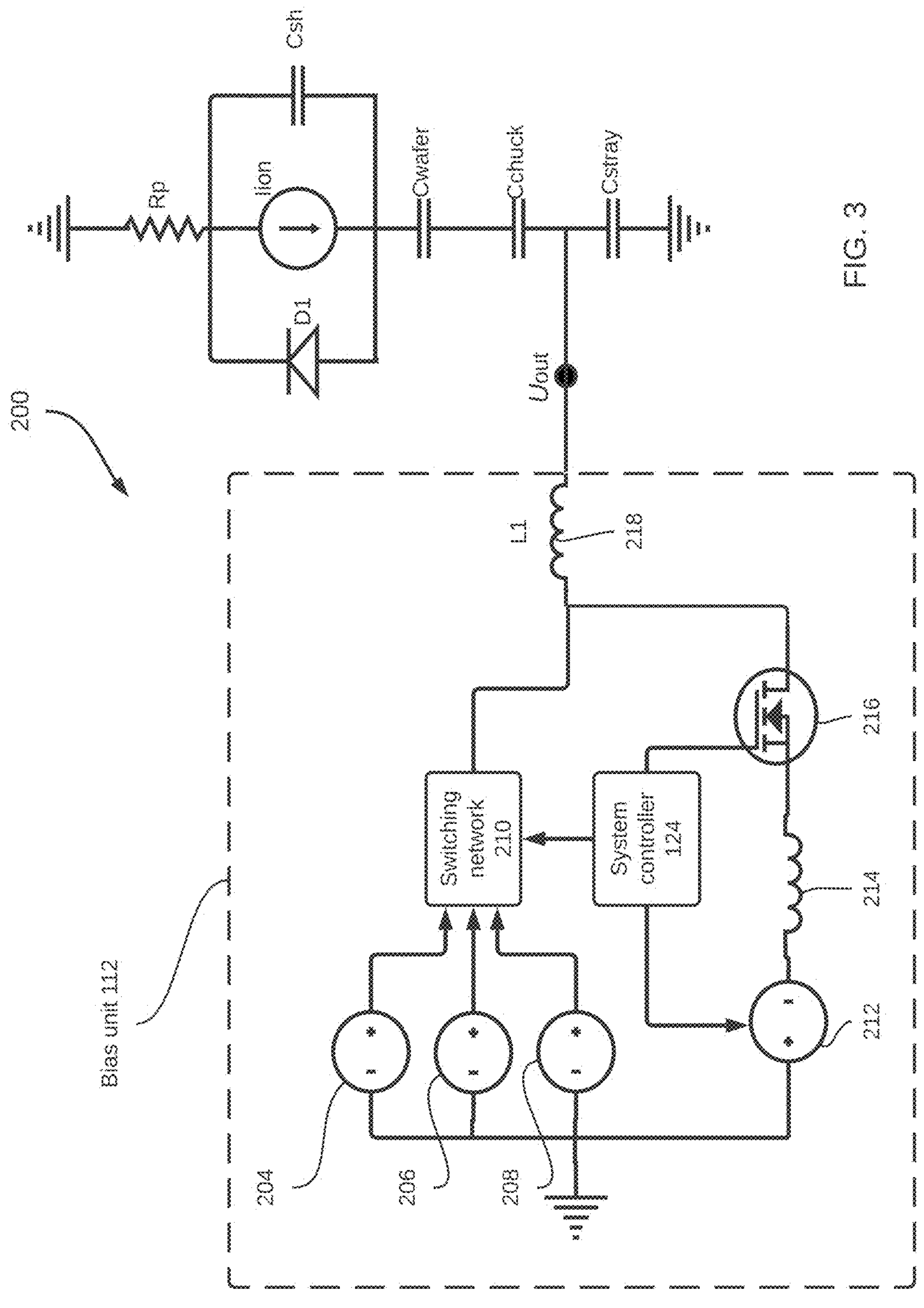

FIG. 3: Illustrates an embodiment wherein the tailored waveform bias is implemented with a switching mode power converter (SMPC) and a current source.

Figure 4:
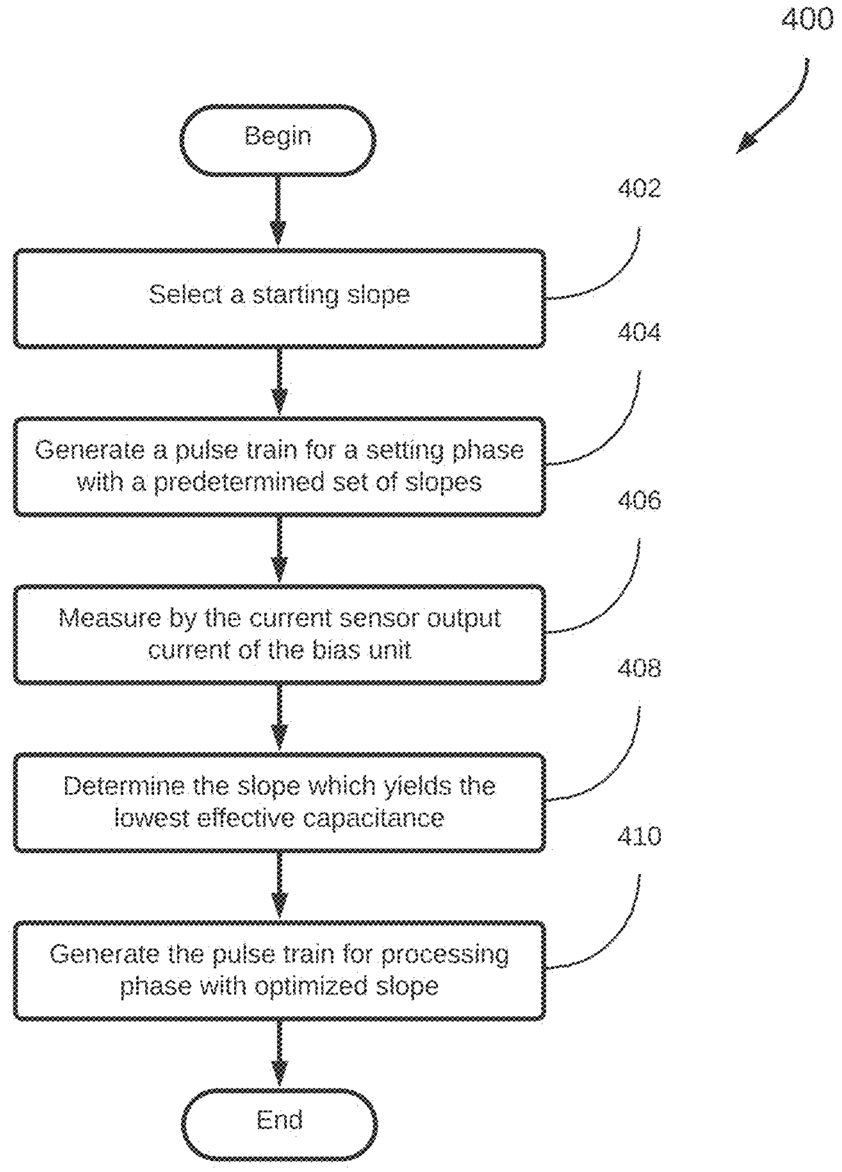

FIG. 4: Displays a flowchart delineating an exemplary process for determining the optimized slope for the ramp step of the waveform.

Figure 5:
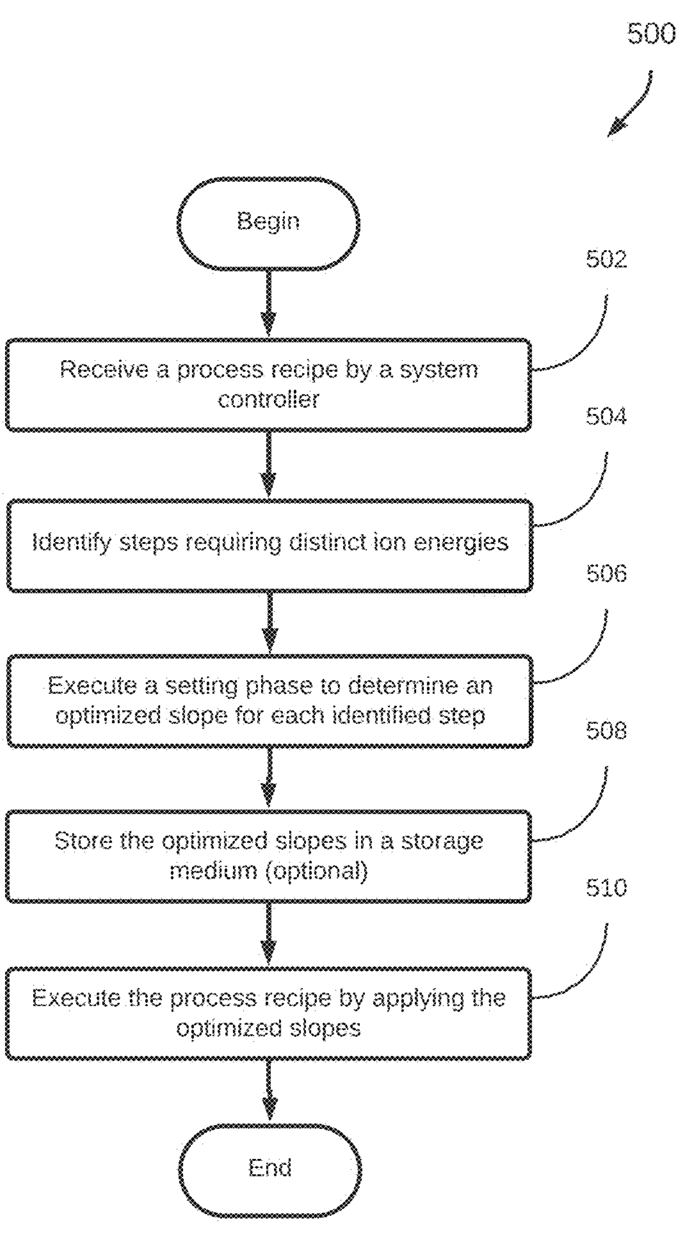

FIG. 5: Illustrates a flowchart embodying a method designed to generate optimized slopes for a process recipe, with steps necessitating disparate ion currents.

DETAILED DESCRIPTIONS

To ensure comprehensive understanding, this section delves into detailed embodiments of the present invention. Although certain specifics are provided for clarity, modifications and variations that align with the subsequent claims are deemed appropriate. Conventional methods and components are highlighted to underscore the distinct features of the invention. Terms used are defined as follows:

Process System: Represents the integrated equipment and machinery used in semiconductor manufacturing for various processes like etching, deposition, and cleaning.

Chamber: Represents the enclosed environment within a process equipment where semiconductor processes occur, such as etching, deposition, and cleaning Vacuum Chamber: Represents an enclosed space with low-pressure conditions, used in semiconductor manufacturing for processes that require controlled atmospheric conditions.

Plasma Process Chamber: A specialized type of vacuum chamber designed for processes involving plasma, used in semiconductor manufacturing for etching, deposition, and cleaning.

Plasma source: A device that generates plasma, a highly ionized gas used in semiconductor manufacturing for etching, deposition, and cleaning. Common types include inductively coupled plasma (ICP), transformer coupled plasma (TCP), and capacitively coupled plasma (CCP). ICP uses an RF magnetic field from a coil to produce plasma. TCP employs a planar coil to deliver RF energy to create plasma through transformer action. CCP generates plasma by applying RF power across two electrodes, creating an electric field that ionizes the gas.

Substrate: Refers to the base material, typically a silicon wafer, upon which semiconductor devices are fabricated.

RF Power Generator: A device that generates radio frequency (RF) power used in semiconductor manufacturing processes to energize plasma for etching, deposition, and cleaning.

Plasma processing: A technique that uses ionized gas (plasma) to modify the surface of a substrate, typically for etching, deposition, and cleaning. This method is widely used in semiconductor manufacturing and materials science to achieve precise surface modifications at the micro and nanoscale.

Tailored Waveform Generator: A device that produces custom electrical waveforms to optimize plasma processes in semiconductor manufacturing.

Switched-mode power converter (SMPC): An electrical device that converts power by rapidly switching semiconductor components, allowing for efficient energy conversion with minimal loss. It can be configured in various topologies like buck, boost, or flyback to control voltage or current output.

Current source: A circuit or device that delivers a constant current to a load, regardless of changes in load resistance or supply voltage, often used for precise current control.

Sheath: A boundary layer between plasma and a surface, controlling ion and electron energy and flux, crucial for etching, deposition, and cleaning.

Pulse train: In the context of a tailored waveform, a pulse train is a sequence of pulses with precisely controlled amplitude, duration, timing, and slope for a ramp step, designed to form a specific waveform profile.

Setting phase: In the context of the present invention, a setting phase is a phase of operation initiated by a system controller to determine optimized slopes for a ramp step within a tailored waveform bias for a process system.

Processing phase: In the context of the present invention, a processing phase is a phase of operation initiated by a system controller to fabricate a wafer using a process recipe, where the slopes for ramp steps within the tailored waveform bias have already been determined during the setting phase.

Chuck: A component in semiconductor manufacturing equipment that holds the wafer in place during processing, where the chuck is coupled to a bias unit which provides a voltage bias to accelerate ions during a plasma processing.

Electrostatic Chuck (ESC): A chuck that uses electrostatic forces to secure the wafer, providing uniform clamping during semiconductor processes.

System Controller: The central unit that manages and controls the operations and parameters of a process system, ensuring coordinated functioning.

Bias Unit: A component that generates a controlled voltage to accelerate ions towards the wafer, crucial for processes like etching.

Process Recipe: A detailed set of instructions and parameters for executing a semiconductor manufacturing process, ensuring consistency and precision.

FIG. 1A illustrates an exemplary process system 100 incorporating a plasma process chamber 102. The chamber 102 establishes a vacuum environment conducive to various processing operations. Though not illustrated, process gases or precursors are introduced into the chamber via a designated delivery unit, while reaction byproducts are evacuated using a vacuum pump.

In some embodiments, a CCP source is utilized. Here, components 104 and 106 function as electrodes for the capacitor, receiving RF power from either the top or the bottom of the chamber. Within the context of this disclosure, the CCP source, in tandem with bias unit (112), serves as a quintessential example to elucidate the inventive concept across diverse embodiments without restricting the invention's scope.

In the CCP configuration, the RF power is channeled to the electrodes, generating an electromagnetic field within the chamber (102). Subsequently, gases within the chamber are ignited, yielding a plasma (110) composed of electrons, ions, and neutrals essential for processes like etching a wafer (108) secured by a chuck (106). In modern plasma etching systems, the bias unit (112) is frequently employed to increase ion energy through a sheath. This bias unit (112) may employ a tailored waveform generator. The tailored waveform generator further includes a SMPC (114) and a current source (116). The bias unit (112) is coupled to the chuck (106) via a cable system (120). An RF power generator (118) may also be connected to the chuck (106) to supply additional RF power for plasma generation.

In alternative embodiments, the plasma source (104) can adopt diverse configurations based on the specific application. For example, the source (104) may be either an ICP or a TCP. Typically, these sources, ICP or TCP, are positioned adjacent to, yet isolated from, the chamber (102), frequently through a dielectric window. In such configurations, RF power is conveyed to a coil from an RF power generator (132), creating an electromagnetic field within the chamber (102). In certain implementations, RF powers are connected to the plasma chamber through matching networks (absent in the figure).

FIG. 1B presents an equivalent electrical circuit 101 of the process system 100. The equivalent electrical circuit of the plasma process chamber using a tailored waveform bias has been discussed extensively by Yu et al., in "Equivalent electric circuit model of accurate ion energy control with tailored waveform biasing" (Plasma Sources Sci. Technol. Vol. 31, 2022, 035012). Upon ignition of a plasma within the chamber (102), a sheath forms. This plasma sheath is modeled as a parallel connection of a diode $D_1$, an ion current source $I_{ion}$, and a sheath capacitor $C_{sh}$. An additional, relatively small sheath, forms between an exposed portion of the chuck (106) and the chamber wall but is neglected for simplicity in this model. The bias unit (112) is coupled to the plasma chamber through two serially connected capacitors: $C_{chuck}$, representing the chuck capacitor, and $C_{wafer}$ representing the wafer capacitor. A stray capacitor $C_{stray}$ and stray inductance $L_s$ are also incorporated into the model. In the model, a plasma resistor $R_p$ determines plasma potential $u_p$.

FIG. 1C exemplifies a tailored waveform (103) where $V_s$ is the setting voltage, assumed to be a negative value determining ion energy. Energetic positive ions strike the wafer surface during a process step. If the wafer surface is shrouded by a dielectric material layer, positive ions can accumulate on it. This accumulation alters the surface potential, diminishes the ion energy, and consequently, the ion currents, while also broadening the ion energy spread undesirable in processes where precise control of ion energy distribution is pivotal. Thus, a linear ramp step, characterized by a slope S, towards a more negative voltage than $V_s$ is necessitated to keep the wafer surface potential $u_{sh}$ constant.

Ensuring that slope S is optimized is crucial for maintaining process consistency in the plasma process chamber. A slope steeper than optimized will instigate overcompensation, thus increasing ion current, while a less-steep slope will induce under compensation, diminishing ion current. Both scenarios widen ion energy distribution.

With the tailored waveform operating at the optimized slope, the wafer surface potential remains constant. No current traverses through $C_{sh}$. Consequently, the current flowing through the chuck equates to the ion current.

Yu et al., in their study titled 'Equivalent electric circuit model of accurate ion energy control with tailored waveform biasing' (Plasma Sources Sci. Technol., Vol. 31, 2022, 035012), demonstrated that the optimized slope S can be determined by plotting the output current against the slope as follows:

$$C_{eff,x} = \frac{i_{out,x+1} - i_{out,x}}{\dot{u}_{out,x+1} - \dot{u}_{out,x}}, \tag{1}$$

Here, the optimized slope corresponds to the minimal $C_{eff}$. Expressed in a different way, the optimized slope corresponds to the minimal changes in the output current as a function of the varied slope.

FIG. 2A illustrates an embodiment of a process system (140) with a tailored waveform bias as an implementation of the bias unit (112), furnished with real-time control capabilities. When contrasted with FIG. 1A, which depicts a conventional process system (100), differences are as follows:

A current sensor (122) is incorporated to measure the output current of the bias unit (112). The current sensor (122) can manifest in various forms; for instance, the current sensor (122) might be a Rogowski current sensor.

A system controller (124) bifurcates a process recipe (126) into a setting phase (128) and a processing phase (130). In the setting phase (128), the process recipe (126) is tabulated as (129) and includes a pulse train (142) with steps ($T_1$, $T_2$, $T_3$, . . . , $T_n$). Each step includes a ramp step with a distinct slope ($S_1$, $S_2$, $S_3$, . . . , $S_n$) for each pulse ($P_1$, $P_2$, $P_3$, . . . , $P_n$). The pulse train (142) may cover an adequately broad range of slopes. FIG. 2B exemplifies the pulse train (142) and (144). In some implementations, the pulse train (142) might be segmented into groups, each consisting of multiple pulses with a common slope.

During the setting phase, the pulse train (142) is generated by the bias unit (112). The output current of the bias unit (112) is measured for each of the ramp steps of the pulse within the pulse train by the current sensor (122). These measured currents are transmitted to the system controller (124), which analyzes them as a function of the slopes and determines the optimized slope corresponding to the minimum $C_{eff}$ according to the Equation (1). During the processing phase, the pulse train (144) consists of steps ($T_{n+1}$, $T_{n+2}$, $T_{n+3}$, . . . , $T_n$+m) with pulses ($P_{n+1}$, $P_{n+2}$, $P_{n+3}$, . . . , $P_{n+m}$), each having the same optimized slope $S_o$ for the ramp steps of the pulses within the pulse train (144).

It's vital to note that the pulse train (142) is significantly shorter than the pulse train (144) used during the processing phase. Thus, the effects of the varied slope in the setting phase on the on-wafer results are negligible.

A notable advantage of this system and method lies in the invisibility of the setting phase to a user of the process system (140). There is no necessity to modify a process recipe. The system controller (124) employs this novel method to optimize the slope, thereby ensuring constant ion current and energy in real-time.

The system and method can be implemented in varied forms. For example, the setting phase can be interjected at various points in the processing phase where a change in ion current is anticipated due to evolving processing conditions. The setting phase could also be appended to the end of the process recipe to validate that the process conditions have been optimized. In alternative implementations, groups of pulses, instead of single pulse, might be used to ascertain a relationship between the output current and the slope, assisting in filtering out noise generated by either the measurement process or the plasma chamber itself.

In yet other implementations, the setting phase may be applied selectively for certain wafers, instead of universally for every wafer running the same process recipe. The optimized slope will be stored in the controller (124) for processing subsequent wafers.

In still other implementations, the setting phase can be designed as an independent set $u_p$ test without mixing with the actual processing of a wafer. The measured current as a function of the slopes can be recorded in a storage medium of the system controller (124). The optimized slope can be computed and adopted by a process recipe before processing of the wafer.

It should also be noted that a modern process recipe can involve several plasmas states, and that each may require a different ion energy. Thus, the system and method can be adopted for each plasma state in the process recipe to optimize the slope separately.

FIG. 3 presents a schematic diagram of an embodiment (200) of the bias unit (112), connected to the plasma process chamber, illustrated by using equivalent electrical circuits. The bias unit (112) comprises a SMPC, exemplarily constructed with three voltage sources: 204, 206, and 208. Each voltage source furnishes a distinct voltage level, correlating with the intended tailored waveform. The SMPC might possess more or fewer voltage sources; one may supply the positive voltage level (Va), while another may offer the negative setting voltage ($V_s$). These voltage sources are connected to a switching network (210), which incorporates switches like MOSFETs. The current source consists of a negative voltage source (212) and an inductor (214). The current source is coupled to chuck (106) through a switch (216), demonstrated exemplarily as a MOSFET. There are numerous methods to formulate a current source, as recognized in the art. The voltage source (212) is connected to the system controller (124), which, in the setting phase, enables the voltage source (212) to generate variant voltages for each pulse, translating into different slopes. The bias unit (122) comprises an inductor $L_1$ placed between the output of the bias unit (122) and the chuck (106).

FIG. 4 outlines a flowchart of an exemplary process (400) for determining the optimized slope. Process 400 initiates with step 402 where the system controller (124) selects a starting slope. This initial slope might be devised based on a model or historical data. Various methods can generate an array of slopes from the initial one. For instance, the initial slope might be the apex value in the array, with each subsequent pulse adopting an incrementally lower value, or vice versa. Alternatively, the initial slope might serve as a mid-point in the array. In step 404, the system controller (124) generates a pulse train for the setting phase based on a predetermined set of slopes in the array. Step 406 sees the deployment of the setting phase by the system controller (124), while the output current of the bias unit (112) is measured by the current sensor (122) for each slope. The measured currents are dispatched to the system controller (124), and the optimized slope is ascertained in step 408 according to the Equation (1). In one implementation, the optimized slope is determined by establishing a mathematical model using the received data which yields the minimum $C_{eff}$. In another implementation, a lookup table is crafted, and the optimized slope is discerned by analyzing the table, applying techniques such as extrapolation and interpolation. The slope is chosen by seeking the minimal $C_{eff}$ and identifying its affiliated slope. Lastly, in step 410, the system controller (124) generates a pulse train for the processing phase, utilizing the optimized slope $S_o$.

FIG. 5 illustrates a flowchart embodying a method designed to generate optimized slopes for a process recipe, with steps necessitating disparate ion currents. The process (500) commences with the system controller (124) receiving a process recipe (126) at step 502. After this, in step 504, the controller scrutinizes the recipe, identifying steps that mandate different ion energy within the plasma chamber. Following this analysis, a setting phase is conceived and executed in step 506, wherein the optimized slope for each of the process steps is discerned, utilizing process 400 as a guide. After the determination of optimized slopes, they are preserved optionally within a storage medium, located in the system controller (124), in step 508.

Culminating the process, the recipe—now assimilating the optimized slopes for the identified steps are implemented in step 510. This detailed methodology provides a robust, automated approach towards real-time control and optimization of plasma processes, ensuring that variations in ion current requirements across diverse phases of the recipe are aptly accommodated, thereby enhancing the precision and consistency of the plasma process chamber's output.

The invention claimed is:

1. A process system, comprising:

a vacuum chamber configured for processing of a wafer;

a chuck configured to sustain the wafer;

a bias unit coupled to the chuck, the bias unit comprising an SMPC, a current source designed to produce varied currents;

a current sensor positioned at an output terminal of the bias unit, wherein the bias unit is configured to generate a waveform that includes a positive voltage step, a negative voltage bias setting point, and a linear descent slope towards a voltage more negative than the negative bias setting point;

wherein a system controller is configured to manage the waveform during a setting phase by initiating a pulse train comprising multiple groups of pulses, each group having a consistent slope, with different groups having varied slopes;

wherein an output current of the bias unit is detected by the current sensor within each group, and the system controller is further configured to average output currents measured within each group to mitigate noise interference and determine an optimized slope by identifying the slope corresponding to the minimum change in the output current as a function of the varied slope; and wherein, during a processing phase, the system controller directs the bias unit to apply a pulse train with the optimized slope.

2. The system of claim 1, wherein the SMPC comprises multiple voltage sources and a switching network.

3. The system of claim 1, wherein the current generated by the current source is adjustable by the system controller.

4. The system of claim 1, wherein the setting phase and the processing phase are conducted sequentially within a single process event.

5. The system of claim 1, wherein the setting phase and the processing phase are conducted independently, and the optimized slope is applied to process recipes for processing multiple wafers.

6. The system of claim 1, wherein the current source comprises a voltage source coupled with an inductor.

7. The system of claim 1, wherein the current sensor comprises a Rogowski coil sensor.

8. A method for generating a voltage bias for accelerating ions in a plasma process chamber, comprising:

receiving a process recipe by a system controller;

generating a first pulse train by a bias unit, the first pulse train comprising a plurality of pulses, each represented by a waveform exhibiting a positive voltage step, a negative voltage setting point, and a linear ramp step towards a voltage more negative than the setting point, wherein varied slopes are assigned to the ramp steps, wherein the system controller is configured to manage the waveform during a setting phase by initiating the first pulse train comprising multiple groups of pulses, each group having a consistent slope, with different groups having varied slopes;

measuring an output current of the bias unit by a current sensor within each group, wherein the system controller is further configured to average output currents measured within the group to mitigate noise interference;

determining an optimized slope by identifying the slope corresponding to the minimum change in the output current as a function of the varied slope; and generating, by the bias unit, a second pulse train comprising multiple pulses, wherein the ramp steps adopt the optimized slope.

9. The method of claim 8, further comprising generating the varied slopes by adjusting the output current of a current source within the bias unit, as commanded by the system controller.

10. The method of claim 8, wherein determining the optimized slope involves recording measured output currents corresponding to each slope in a storage medium of the system controller.

11. The method of claim 8, wherein determining the optimized slope involves formulating a mathematical model that illustrates the relationship between the output current and the slope.

12. The method of claim 8, wherein determining the optimized slope includes creating a lookup table that defines the relationship between the output current and the slope.

13. The method of claim 8, wherein generating the first and second pulse trains occurs within a single process event for a process recipe.

14. The method of claim 8, wherein generating the first pulse train and determining the optimized slope occur as separate events, distinct from multiple process events involving various wafers utilizing the process recipe.

15. The method of claim 14, wherein the optimized slope is stored by the system controller and used for process events involving multiple wafers.

* * * * *